United States Patent [19]

Kosonocky

[11] Patent Number: 4,866,497

[45] Date of Patent: Sep. 12, 1989

[54] INFRA-RED CHARGE-COUPLED DEVICE IMAGE SENSOR

[75] Inventor: Walter F. Kosonocky, Skillman, N.J.

[73] Assignee: General Electric Company, Schenectady, N.Y.

[21] Appl. No.: 616,199

[22] Filed: Jun. 1, 1984

[51] Int. Cl.⁴ .................... H01L 29/78; H01L 27/14; H01L 31/00

[52] U.S. Cl. ....................................... 357/24; 357/30

[58] Field of Search ................................... 357/24, 30

[56] References Cited

U.S. PATENT DOCUMENTS

| | | | |
|---|---|---|---|
| 3,481,781 | 12/1969 | Kern | 117/215 |
| 3,856,989 | 12/1974 | Weimer | 357/24 LR |
| 4,040,076 | 8/1977 | Kosonocky et al. | 357/24 LR |
| 4,375,597 | 3/1983 | Kosonocky | 357/24 LR |
| 4,518,978 | 5/1985 | Takeshita | 357/24 LR |
| 4,548,671 | 10/1985 | Kosonocky et al. | 357/30 |

OTHER PUBLICATIONS

"Design and Performance of 64×128 Element PtSi Schottky-barrier Infrared Charge-Coupled Device (IRCCD) Focal Plane Array" by W. F. Kosonocky et al., SPIE, vol. 344, Infrared Sensor *Technology (1982), pp. 66–77.*

*Primary Examiner*—Gene M. Munson
*Attorney, Agent, or Firm*—Henry I. Steckler; James C. Davis, Jr.; Paul R. Webb, II

[57] ABSTRACT

An infra-red charge-coupled device (IR-CCD) image sensor includes a substrate of single crystalline silicon having at one surface thereof a plurality of detectors arranged in space relation along a plurality of columns and a separate charge-coupled device (CCD) register extending along each column of detectors between the columns. Each CCD register includes a buried channel within the substrate and extending along and spaced from the detectors in the adjacent columns and at least two sets of gates extending completely across the space between the columns of detectors and crossing the buried channel. The gates are insulated from this substrate surface by a layer of silicon oxide. A first set of the gates are spaced apart along the column of detectors with each of the first gates having an extension extending over and insulated from the space between two adjacent detectors of one of the adjacent columns. A second set of gates are positioned between the first set of gates and each of the second gates has an extension extending over and insulated from the extension of one of the first gates. The gate extensions electrically connect corresponding gates of each of the CCD registers and extend to a terminal at an edge of the array. The gates of the CCD register form a surface barrier CCD with the portion of the substrate which is between the buried channel and the adjacent detectors which will prevent flow of charge from the detectors to the buried channel when the gates have a negative voltage applied thereto. The extensions of the first gates form a surface barrier CCD with the portion of the substrate between the detectors which will prevent flow of charge between adjacent detectors when the extensions have a negative voltage applied thereto. The surface channel CCD between each of the second gates and an adjacent detector will allow flow of charge from the adjacent detector to the buried channel when a positive voltage is applied to the second gate.

20 Claims, 5 Drawing Sheets

PRIOR ART

*Fig. 2*

PRIOR ART

INFRA-RED CHARGE-COUPLED DEVICE IMAGE SENSOR

The government has rights in this invention pursuant to Contract No. F19628-61-C-0108 awarded by the Department of the Air Force.

The present invention relates to an infra-red charge-coupled device (IR-CCD) image sensor and more particularly to such a device of simplified structure which allows for a large number of sensor elements.

BACKGROUND OF THE INVENTION

One type of IR-CCD image sensor which has been developed includes a plurality of Schottky-barrier IR detectors arranged in rows along the surface of a substrate of single crystalline silicon. Between the rows of the detectors are CCD registers each of which is coupled to a row of IR detectors to receive the detected charge signal from the detectors. The CCD registers are coupled to an output CCD register to which the detected signal is transferred. Such an image sensor is shown and described in the article of W. F. Kosonocky et al., entitled DESIGN AND PERFORMANCE OF 64×128 ELEMENT PtSi SCHOTTKY-BARRIER INFRARED CHARGE-COUPLED DEVICE (IRCCD) FOCAL PLANE ARRAY, published in SPIE, Volume 344, Infrared Sensor Technology (1982), pp 66–77. In this type of array each detector includes a layer of a conductive material, such as platinum silicide or palladium silicide, along the surface of the silicon substrate and forming a Schottky-barrier junction with the substrate. Around and contacting each of the conductive layers is a guard ring, which is a region within the silicon substrate of a conductivity opposite to that of the substrate. Also around each of the detector areas and between adjacent guard rings is a channel stop, which is a region within the substrate of the same conductivity type as but of higher conductivity than that of the substrate. The guard rings serve to reduce fields at the edge of the Schottky-barrier junctions and the channel stops serve to prevent leakage of charge between adjacent detector areas and between each detector area and the adjacent CCD register to which the detector is not connected. Also, transfer gates extend along the row of detectors between the detector and its adjacent CCD register to transfer the charge in the detector to the CCD register. The transfer gate is in the form of a strip of conductive material, such as conductive polycrystalline silicon, which is insulated from the substrate by a layer of silicon oxide.

A problem with the above-described structure is that the peripheral elements, such as the channel stops and transfer gates, take up a relatively large amount of space over the surface area of the substrate. To obtain better resolution of the images detected, it is desirable to provide the image sensor with a larger number of detector elements. However, it is also desirable to maintain the overall size of the sensor as small as possible. Also, it is desirable to form an image sensor which has a high fill factor, which is the ratio of the active detector area to the total area of an image cell. Reducing the dead space between and around the detector areas, which is where the channel stops and transfer gate are located, will provide both a higher fill factor and minimize the overall size of the image sensor.

SUMMARY OF THE INVENTION

An infra-red charge-coupled device (IR-CCD) image sensor includes a substrate of single crystalline silicon having along one surface thereof a plurality of infra-red detectors arranged in spaced relation along a column and a charge-coupled device (CCD) extending along the column of detectors. The CCD includes a buried channel of a conductivity type opposite to that of the substrate within the substrate and extending along and spaced from the detectors, and at least two sets of conductive gates extending transversely across and insulated from the buried channel and the portion of the substrate between the buried channel and the detectors. The gates of the first set are spaced along the detectors and each has an extension extending over and insulated from the portion of the substrate between two adjacent detectors. The gates of the second set are between the gates of the first set.

DETAILED DESCRIPTION OF PREFERRED EMBODIMENT

Figure 1:
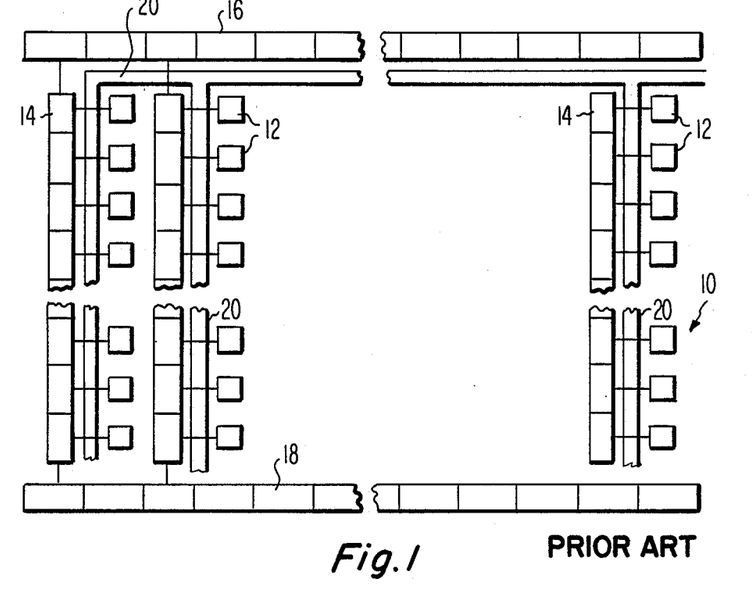
FIG. 1 is a schematic view of the of a typical IR-CCD image sensor.

Referring initially to FIG. 1, there is shown a schematic block diagram of a typical IR-CCD sensor array, which is generally designated as 10. The sensor array 10 includes a plurality of IR detectors 12 arranged in parallel, vertical columns. Extending along each column of detectors 12 is a vertical column CCD register 14 to which the detectors 12 of the adjacent vertical array are connected. An input CCD register 16 extends along one end of the vertical column CCD registers 14 and is connected to each of the vertical column CCD registers 14. An output CCD register 18 extends along the other ends of the vertical column CCD registers 14 and is connected thereto. A transfer gate 20 extends between each column of detectors 12 and its adjacent vertical column CCD register 14 for transferring charge from the detectors 12 to the CCD register 14.

Figure 2:
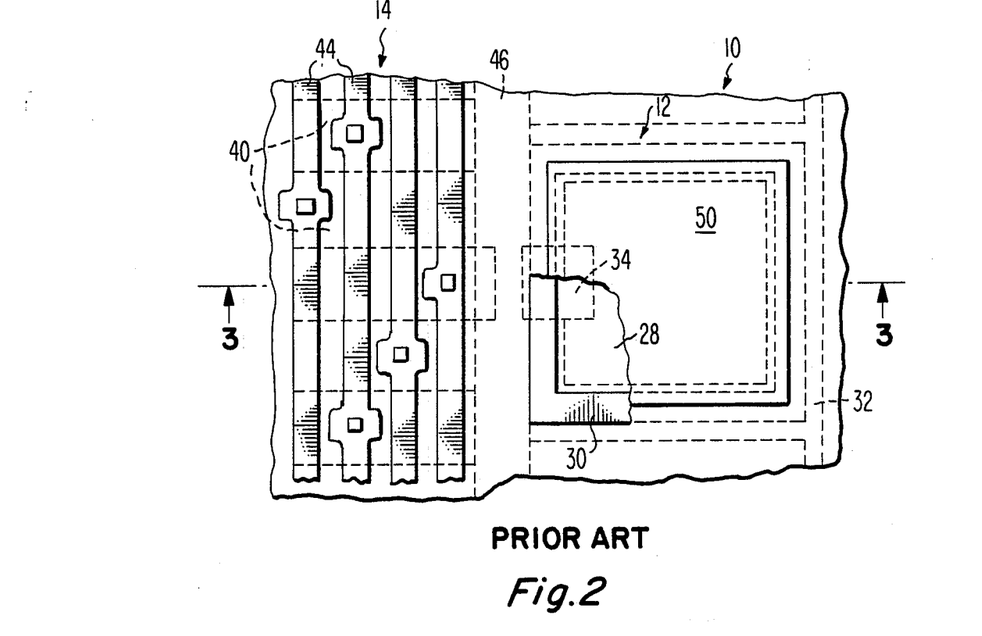
FIG. 2 is a top plan view of one pixel of a IR-CCD image sensor of the prior art.
Figure 3:
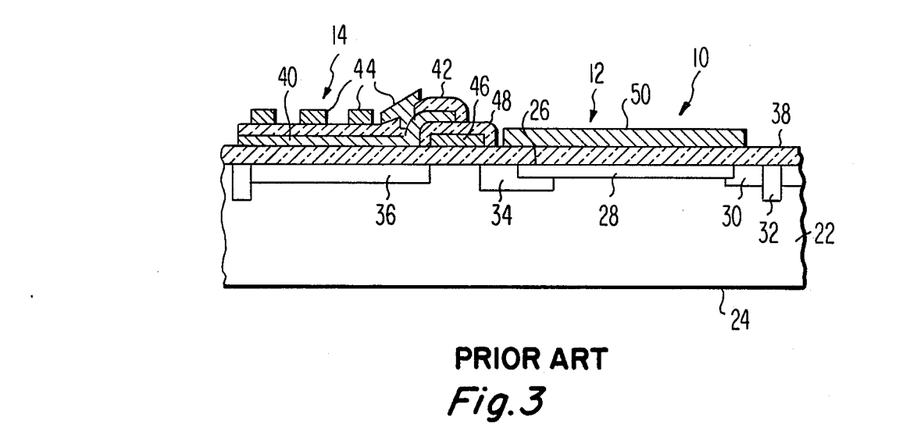
FIG. 3 is a sectional view along line 3—3 of FIG. 2.

Referring to FIGS. 2 and 3, there is shown the details of construction of one pixel of a prior art IR-CCD image sensor, which pixel includes one detector 12 and a portion of its related vertical column CCD register 14. The sensor array 10 is formed in and on a substrate 22 of single crystalline silicon of P-type conductivity which has a pair of opposed major surfaces 24 and 26. The detector 12 is a thin layer 28 of a conductive material, such as a silicide of platinum or palladium, formed in the substrate 22 along the surface 26. The conductive layer 28 forms a Schottky-barrier junction with the substrate 22. Extending around the edge of the conducting layer 28 is a guard ring 30 in the form of a region of N-type conductivity extending into the substrate 22 from the surface 26. Around the guard ring 30 is a channel stop 32 in the form a region of P+ type conductivity extending into the substrate 22 from the surface 26. The depth of the channel stop region 32 into the substrate 22 is greater than that of the guard ring region 30. At the edge of the conducting layer 28 adjacent to the vertical CCD register 14 is a conductive region 34 of N+ type conductivity extending into the substrate 22 from the surface 26 and partially overlapping and forming a contact with the conductive layer 28.

The vertical CCD register 14 includes a buried channel 36 in the form of an N-type region within the substrate 22 extending along the surface 26 parallel to the column of the detectors 12. A thin layer 38 of silicon oxide extends across the entire surface 26 of the substrate 22. A plurality of side-by-side gates 40 are on the silicon oxide layer 28 and extend transversely across the channel 36. The gates 40 are layers of a conductive material, such as conductive polycrystalline silicon. A layer 42 of silicon oxide extends over the gates 40. Four metal buss lines, generally of aluminum, are on the silicon oxide layer 42 and extend in space, parallel relation across the gates 40. Each of the buss lines 44 extends through openings in the silicon oxide layer 42 to contact separate ones of the gates 40. Each of the buss lines 44 is connected to every fourth gate 40.

A transfer gate 46 is on the silicon oxide layer 38 and extends between the detectors 12 and the vertical CCD register 14. The transfer gate 46 is a layer of a conductive material, such as doped polycrystalline silicon. The transfer gate 46 overlaps a portion of each of the conductive regions 34 and an edge of the channel region 36. A layer 48 of silicon oxide extends over the transfer gate 46. The gate 40 of the vertical CCD register 14 is in alignment with the conductive region 34 of the detector 12. This allows for transfer of the charge from the detector 12 to the vertical CCD register 14. A thin layer 50 of a metal, such as aluminum, is on the silicon oxide layer 36 over each of the conducting layers 28 of the detectors 12. The metal layer 50 serves as a mirror to reflect any light which may pass through the conductive layer 28 back into the conducting layer.

In the above-described image sensor 10, the channel stops 32 and transfer gates 46 take up space over the surface of the substrate 22 which reduces the amount of area which can be used for the detectors 12. Also, the need for the series of buss lines 44 to make connections to the gates 40 of the vertical CCD register 14 increases the overall size of the register 14. In addition, the need for the channel stops 32, transfer gates 46 and buss lines 44 adds steps to the method of making the image sensor 10 which adds to the overall cost for making the sensor.

Referring to FIGS. 5-8, an IR-CCD image sensor which incorporates the present invention is generally designated as 52. Image sensor 52 includes an array of detectors 54 arranged in columns, and vertical CCD registers 56 between the columns of the detectors 54. The image sensor 52, like the prior art image sensor 10, is formed in a substrate 58 of P-type conductivity single crystalline silicon having opposed major surfaces 60 and 62.

Each of the detectors 54 includes an area 64 of a conductive material in the substrate 58 and along the surface 62, which forms a Schottky-barrier junction with the substrate 58. The detector area 64 is preferably of either platinum silicide or palladium silicide. Around the edge of the detector area 64 is a guard ring 66 in the form of a region of N type conductivity within the substrate 58 at the surface 62. Along the edge of the detector area 64 adjacent the vertical CCD register 56 is a conductive region 68 of N+ type conductivity in the substrate 58 at the surface 62. The conductive region 68 serves to provide electrical coupling of the electrical charge from the detector 54 to the channel of the vertical CCD register 56. However, if desired, by making the entire guard ring 66 of N+ type conductivity the guard ring 66 will also serve as the conductive region. A layer 70 of deposited silicon oxide is on the surface 62 of the substrate 58 and extends over the detector area 64. A metal layer 72 is on the silicon oxide layer 70 over each of the detector area 64. The metal areas 72 are of a metal such as aluminum which will reflect light, to serve as mirrors to reflect back into the detector area 64 any light which may pass therethrough.

Figure 5:
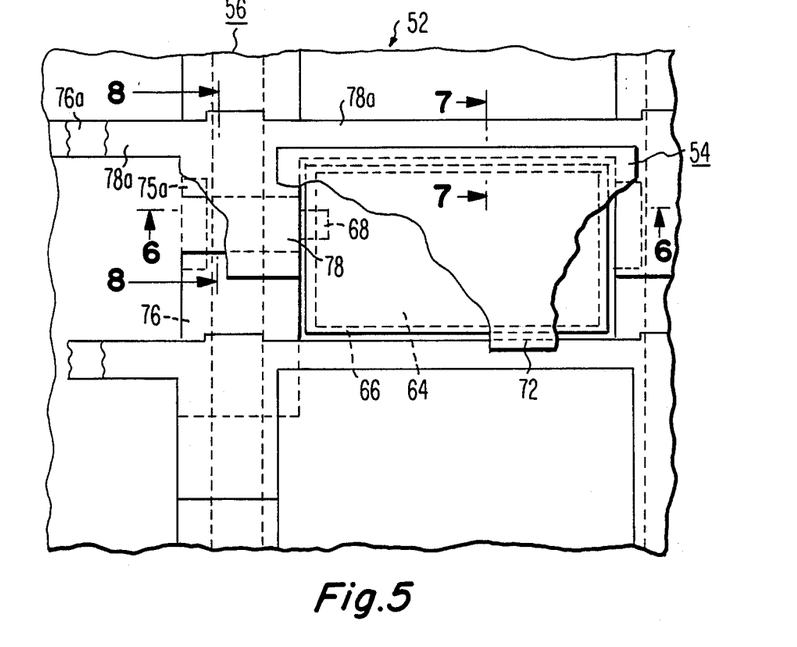
FIG. 5 is a top plan view of a portion of an IR-CCD image sensor incorporating the present invention.
Figure 6:
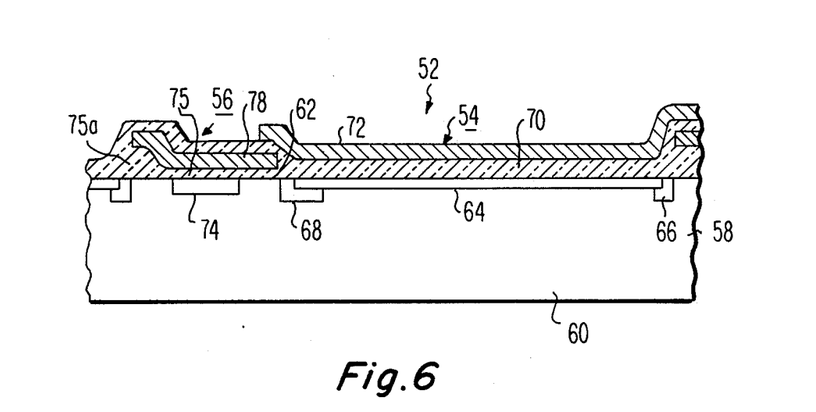
FIG. 6 is a sectional view taken along line 6—6 of FIG. 5.
Figure 7:
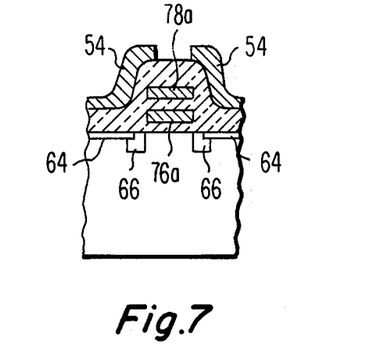
FIG. 7 is a sectional view taken along line 7—7 of FIG. 5.

The vertical CCD register 56 includes a channel 74 in the form of a region of N-type conductivity within the substrate 58 and extending along the surface 62 between the columns of the detectors 54. The channel 74 is spaced from the adjacent edges of the detector area 64 of the detectors 54. A thermally grown layer 75 of silicon oxide extends over the channel 74. Two sets of gates 76 and 78 are on the silicon oxide layer 75 and extend across the channel 74. The gates 76 and 78 are of a conductive material, such as doped polycrystalline silicon. The first set of gates 76 are all directly on the silicon oxide layer 75 and each of the gates 76 extends along a portion of two adjacent detectors 54 crossing the space between the two adjacent detectors 54. The adjacent ends of adjacent gates 76 are spaced apart in the portion of the channel 74 adjacent the conductive region 68 of the adjacent detector 54. Each of the first set of gates 76 has an extension 76a which, as shown in FIG. 7, extends over the substrate surface 62 between adjacent detectors 54 and is spaced from the substrate surface 62 by a portion of the silicon oxide layer 75. The gate extensions 76a electrically connect similar first gates 76 in all of the vertical CCD registers 14 and one of the extension 76a extends to a terminal contact at one edge of the sensor array 10.

Figure 8:
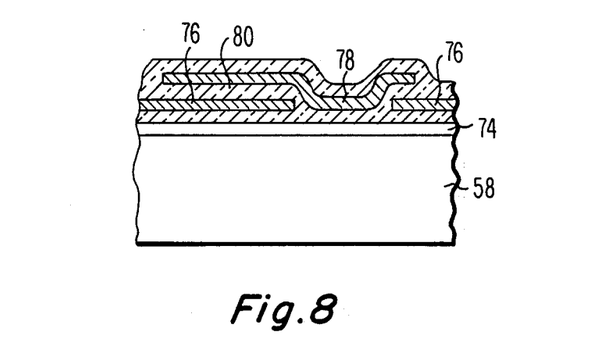
FIG. 8 is a sectional view taken along line 8—8 of FIG. 5.

As shown in FIG. 8, each of second gates 78 is on the oxide layer 75 between the spaced edges of two adjacent first gates 76. The second gate 78 extends slightly over one of the adjacent first gates 76 and extends over the other adjacent first gate 76 to the space between two adjacent detectors 54. The second gate 78 is spaced from the first gate 76 by a layer 80 of silicon oxide. As shown in FIG. 6, each of the second gates 78 extends up to the edge of the detectors 54 at each side of the vertical CCD register 56. Thus, the second gate 78 projects beyond each side of the channel 74 and over the portions of the substrate surface 62 between the channel 74 and each of the adjacent detectors 54. In the area of the substrate surface 62 which is between the channel 74 and the detector 54 which is not connected to the particular vertical CCD register 56 the silicon oxide layer 75 has a portion 75a which is thicker than the rest of the silicon oxide layer 75. A portion of each of the second gates 78 extends over the thicker portion 75a of silicon oxide so that it is spaced from the substrate surface 62 a distance greater than the spacing between the rest of the gate 78 and the substrate surface 62. Each of the second gates 78 has an extension 78a which, as shown in FIG. 7, extends over an extension 76a of a first gate 76 and is spaced therefrom by a portion of the silicon oxide layer 80. The extension 78a electrically connect corresponding second gate 78 of the various vertical CCD registers 56 with one of the extensions 78a extending to terminals at one edge of the image sensor array 52.

Figure 4:
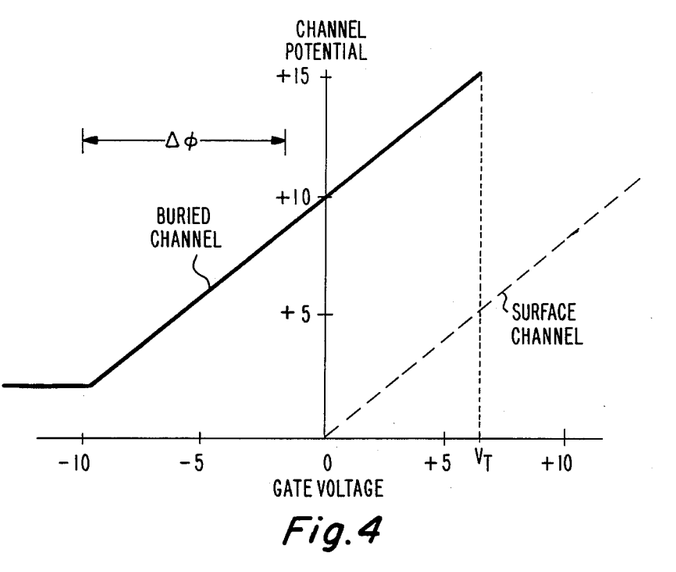
FIG. 4 is a graph showing channel potentials of a surface channel CCD and a buried channel CCD as a function of gate potential.

In the image sensor array 52, the channel 74 and the portion of the gates 76 and 78 thereover form a buried channel CCD. The portions of the gates which project beyond the side edges of the channel 74 form, with the portions of the substrate surface 62 thereunder, a surface channel CCD. Each of the gate extensions 76a and 78a form with the portion of the substrate surface 62 thereunder a surface channel CCD. As shown in the graph of FIG. 4, a surface channel CCD requires a positive voltage ($V_T$) applied to the gate in order to achieve a positive channel potential with respect to the substrate potential, whereas a buried channel CCD can achieve such a positive channel potential by applying a negative voltage to the gate.

In the operation of the image sensor array 52 of the present invention, a positive voltage ($V_T$) applied to a second gate 78 will produce a positive channel potential in the portion of the substrate 58 under the gate 78 and between the channel 74 and the conductive region 68 of the detector 54 which allows charge in the detector 54 to pass from the detector 54 into the portion of the channel 74 under the second gate 78. However, since the portion of the second gate 78 which is over the thicker portion 75a of the oxide layer is spaced further from the substrate surface 62 than the rest of the gate 78, a higher voltage is required to cause conduction of charge to the channel 74 from the detector 54 to which the particular vertical register 56 is not connected. Thus, the flow of charge into the channel 74 will only be from the appropriate detector 54.

A positive voltage applied to the second gate 78 to achieve flow of charge from the detectors 54 into the channel 74 of the vertical CCD registers 56 also applies a positive voltage to the extension 78a of the second gate 78. The positive voltage on the extension 78a would apply a potential to the portions of the substrate 58 between the detectors 54 which could cause a flow of charge between the adjacent detectors 54. However, a negative voltage is applied to each of the first gates 76 and the extension 76a. Since the extension 76a of the first gate 76 is closer to the substrate surface 62 than the extension 78a of the second gates 78, the negative voltage on the first gate extension 76a shields the substrate 58 from the positive voltage on the second gate extension 78a and thus prevents a potential being applied to the portions of the substrate 58 between adjacent detectors 54. Thus, the negative potential applied to the first gate extension 76a serves as a channel stop to prevent the flow of charge between adjacent detectors 54.

Once the charge from the detectors 54 is transferred to the channel 74 of the vertical CCD register 56, the gates 76 and 78 are clocked with a negative potentials ($\Delta\phi$ in FIG. 4) to cause the charges to move along the channel 74 to the output register at the end of the vertical registers 56. During this operation, corresponding to the optical integration of the Schottky-barrier detectors, the detectors are surrounded by channel stops in the form of surface channel CCD's driven into accumulation by the negative voltage applied to the gates. This provides an operational form of blooming control described in the previously referred to article of W. F. Kosonocky et al. The negative potential applied to the gates 76 and 78 not only result in the gate extensions 76a and 78a acting as channel stops between adjacent detectors 54, but also result in the gates 76 and 78 acting as channel stops between the detectors 54 and the CCD channel 74.

Thus, in the image sensor 52 of the present invention the second set of gates 78 serve to transfer charge from the detectors 54 to the channel 74 of the vertical CCD register 56 as well as being one of the gates of the vertical CCD register. This eliminates the need for the transfer gate 46 of the prior art image sensor. During the clocking of the gates 76 and 78, the gates serve to provide the channel stop function between the detectors and the CCD channel. The gate extensions 76a and 78a serve to connect the gates of the various vertical CCD registers 56 which eliminates the need for the buss lines 44 of the prior art image sensors, and also serve to provide the channel stop function between adjacent detectors 54 which eliminates the need for the buried channel stops 32 of the prior art sensors. Since the transfer gate has been eliminated, the vertical CCD registers 56 can be made narrower and thus improve the fill factor of the image sensors. By eliminating the transfer gate, buss lines and buried channel stops, the image sensor 52 requires fewer processing steps so that it is simpler and less expensive to manufacture.

The image sensor 52 can be made using standard semiconductor techniques. The substrate 58 is first provided with a layer of silicon oxide on the surface 62. This can be achieved by exposing the substrate surface 62 to water vapor and hydrogen chloride at a temperature of 900° C. to thermally grow a layer of silicon oxide thereon. A layer of a resist is then applied to the silicon oxide layer and, using standard photolithographic techniques, the resist layer is defined to provide it with openings over the areas of the substrate surface 62 where the channel 74 are to be formed. The portions of the silicon oxide layer exposed by the openings in the resist layer are then removed with a suitable etchant to expose the portions of the substrate surface. Ions of an N type conductivity modifier, such as phosphorus, are then implanted into the exposed portions of the substrate surface 62 to form the channel 74. The silicon oxide layer is then removed from the substrate surface 62 and a new silicon oxide layer of the desired thickness for the oxide layer 75 is then thermally grown on the substrate surface 62.

A first layer of polycrystalline silicon is then deposited over the silicon oxide layer, such as by chemical vapor deposition technique using silane ($SiH_4$). The first polycrystalline silicon layer is then doped, generally with phosphorus, to make it conductive. This may be achieved either by ion implantation or exposing the polycrystalline silicon layer to $POCl_3$ at 900° C. The first polycrystalline silicon layer is then defined, using standard photolithographic techniques and either chemical or plasma etching, to form the first set of gates 76 and their extensions 76a. During the etching of the first polycrystalline silicon layer to form the first set of gates 76, some or all of the silicon oxide layer 75 which is between the spaced edges of the first gate 76 may also be removed. Silicon oxide is then thermally grown over the defined first set of gates 76 to form the oxide layer 80 and over any exposed portions of the substrate surface 62 between the spaced edges of the first gate 76.

A second layer of polycrystalline silicon is then deposited on the silicon oxide layer 80 and on the oxide layer between the spaced edges of the first gate 76. After the second polycrystalline silicon layer is doped, it is defined, using standard photolithographic techniques, and etched, to form the second set of gates 78 and gate extension 78a. Silicon oxide is then thermally grown over the second set of gates 78.

The gate 76 and 78 of the various CCD registers 56 and their extensions 76a and 78a define therebetween the areas where the detectors 54 are to be formed, which areas are covered by a layer of silicon oxide. Using standard photolithographic techniques, openings are formed in the silicon oxide over the areas of the substrate surface 62 where the conductive region 68 are to be formed, with one side of each opening being defined by an edge of a second gate 78. Phosphorus is diffused into the exposed areas of the substrate from POCl₃ to form the conductive regions 68.

A silicon oxide layer is regrown over the conductive regions 68 and, using standard photolithographic techniques, openings are formed in the silicon oxide layer over the areas of the substrate surface 62 where the guard rings 66 are to be formed. One edge of these openings is defined by the edges of the gates 76 and 78 and their extensions 76a and 78a. Phosphorus is then implanted into the exposed areas of the substrate 58 to form the guard ring 66 which are self-aligned with the gate 76 and 78 and their extensions 76a and 78a. After ion implantation the substrate is annealed, and an oxide layer is thermally grown over the guard ring 66.

If desired, a protection layer of a phosphosilicate glass (not shown) can then be coated over the entire device. This can be achieved by the chemical vapor deposition method described in the U.S. Pat. No. 3,481,781, of W. Kern, issued Dec. 2, 1969, entitled "Silicate Glass Coating Of Semiconductor Devices", which is incorporated herein by reference. Using standard photolithographic techniques, openings are then formed in the glass layer and the silicon oxide layer thereunder in the areas where the conductive detector areas 64 are to be formed. Also, openings are formed in the glass layer and the silicon oxide layer thereunder at the terminal ends of the gate extensions 76a and 78a where contacts are to be made to the gate extensions. A layer of platinum or palladium is then coated over the glass layer and the portions of the substrate surface 62 exposed by the openings in the glass layer. This can be achieved by either evaporation in a vacuum or by sputtering. The device is then heated to a temperature of about 320° C. which will cause the platinum or palladium to react with the silicon substrate 58 and form the silicide detector areas 64 and the contact areas at the terminal ends of the gate extensions. Any excess metal is then removed with a suitable etchant, such as aqua regia. A layer of silicon oxide is then deposited over the entire device including the detector area 64 and the contact openings. This may be achieved by a chemical vapor deposition technique using silane and either oxygen or water vapor. This deposited silicon oxide layer forms the silicon oxide layer 70 over the detector areas 64. The portion of the silicon oxide layer in the contact openings is then removed using a suitable etchant. A layer of aluminum is then coated over the entire device, such as by evaporation in a vacuum or by sputtering. Using standard photolithographic techniques, the aluminum layer is defined to form the mirrors 72 over the detector area 64 and contacts to the ends of the gate extensions in the contact openings.

Figure 9:
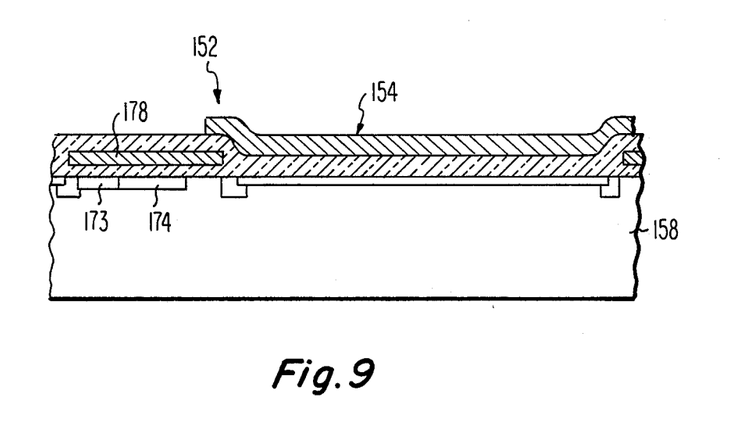
FIG. 9 is a sectional view similar to FIG. 6 of a modification of the IR-CCD image sensor of the present invention.

Referring to FIG. 9, a modification of the image sensor of the present invention is generally designated as 152. The image sensor 152 is substantially identical in construction to the image sensor 52 except that the function of the thicker portion 75a of the silicon oxide layer 75 is performed by a barrier region 173 of the P type conductivity within the substrate 158 between the channel 174 and the adjacent detector 152 to which the vertical CCD register 156 is not connected. Thus, the gate 178 is uniformly spaced from the substrate 158 across the entire width of the gate. The P type barrier region 173 serves to prevent transfer of charges from the adjacent non-connected detector 154 when a positive voltage is applied to the gate 178 to achieve a transfer of charge from the connected detector 154 to the channel region 174 of the CCD register 156. Although the barrier region 173 is shown as extending completely between the channel 174 and the adjacent detector 154, the barrier region 173 can be narrower than the space between the channel 174 and the detector 154. Although the use of the barrier region 173 requires an additional step in the manufacture of the image sensor 152, it has the advantage that it provides a more planar gate topology.

Figure 10:
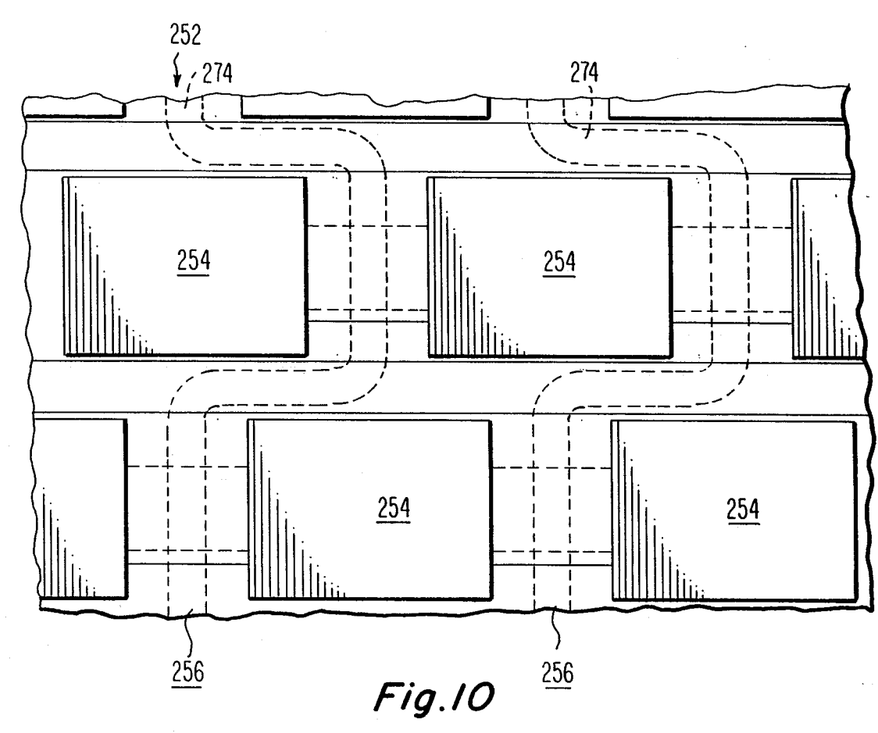
FIG. 10 is a top plan view of a portion of another modification of the IR-CCD image sensor of the present invention.

FIG. 10 shows another modification of the image sensor of the present invention, generally designated as 252. Image sensor 252 is of substantially the same construction as the image sensor 52 except that the detectors 254 in each column are not in a straight line but the detectors 254 in each row are offset from the detectors 254 in the adjacent rows. The channels 274 of each vertical CCD register 256 follows a sinuous path to extend along the detectors 254 in its respective column of detectors. This arrangement has horizontal interlace so as to provide higher horizontal resolution. In addition, it has the same fill factor in both the horizontal and vertical directions.

The image sensor of the present invention has been shown as being implemented with two Schottky-barrier detectors per one stage of vertical CCD register and with two gates per detector for four-phase operation. This provides for an interline transfer imager which can be operated with standard television interlace which transfers first from the odd detectors of each stage (odd field) and then from the even detectors (even field). However, a non-interlaced image sensor of the present invention can be implemented using a three-phase CCD design with three gates per detector. For a three-phase structure the first gates are made smaller so as to extend along only a portion of one detector and a third gate is provided between the second gate and the first gate of the next detector. The first gates have extensions which extend between adjacent detectors and electrically connect similar first gates of all the CCD registers. The third gates also have extensions which extend between the adjacent detectors over and insulated from the extension of the first gates. In making the imager the first gates can be formed from a first level of polycrystalline silicon, the third gates from a second level of polycrystalline silicon and the second gates from a third level second gates along each vertical CCD register and can extend to a terminal at one end of the CCD register. Similarly, the image sensor of the present invention can be formed with any other type of gate structure in which the detectors are surrounded on all sides by the gates.

I claim:

1. In an infra-red charge-coupled image sensor which includes a substrate of single crystalline silicon of one conductivity type having a pair of opposed surfaces, a plurality of infra-red detectors arranged in space relation along one of said surfaces of said substrate and a charge-coupled device register at said one surface of the substrate and extending along said infra-red detectors, the improvement comprising, said register including a channel region of the conductivity type opposite to that of the substrate within the substrate and spaced from the detectors, at least two sets of conductive gates over and insulated from the channel region and extending along the detectors, with the gates of the first set being spaced apart and the gates of the second set being between the gates of the first set, each of the gates of the second set forming a surface channel charge-coupled device with the portion of the substrate between the channel region and the detector adjacent said gate, which surface channel charge-coupled device will allow flow of charge from the detector to the channel region when a positive voltage is applied to said gate but prevent flow of charge when a negative voltage is applied to said gate, and each of the gates of the first set forming a surface channel charge-coupled device with the portion of the substrate which is between the channel region and the adjacent detectors, which surface channel charge-coupled device will prevent flow of charge from the adjacent detector to the channel region when a negative voltage is applied to the first gate.

2. An image sensor in accordance with claim 1 in which each of the first gates has an extension extending over and insulated from the surface of the substrate between adjacent detectors and forming a surface channel charge-coupled device which is adapted to prevent flow of charge between said adjacent detectors when a negative voltage is applied to the first gate.

3. An image sensor in accordance with claim 2 in which the gates are insulated from the surface of the substrate by a layer of silicon oxide on said substrate surface with the gates being on said silicon oxide layer.

4. An image sensor in accordance with claim 2 in which each of said gates is of conductive polycrystalline silicon.

5. An infra-red charge-coupled image sensor comprising a substrate of single crystalline silicon of one conductivity type having a pair of opposed major surfaces, a plurality of infra-red detectors arranged in space relation along one of said substrate surfaces in a plurality of spaced columns, a separate charge-coupled device register extending along said substrate surface between adjacent columns of the detectors, each register including a buried channel of a conductivity type opposite to that of said substrate within the substrate and extending along said one surface between and spaced from adjacent columns of the detectors, a first set of conductive gates spaced along the space between adjacent columns of detectors, each of said first set of gates forming a buried channel charge-coupled device with the buried channel within said space which is adapted to provide a channel potential when a negative voltage is applied to the gate, and each of said first gates forming a surface channel charge-coupled device with the portions of the substrate between the buried channel and the detectors of each of the adjacent columns which will not provide a channel potential therein when the negative voltage is applied to the first gate, a second set of conductive gates along the space between adjacent columns of detectors with each of the second gates being between two of the first gates, each of said second gates forming a buried channel charge-coupled device with the buried channel within said space which will provide a channel potential when a negative voltage is applied to said second gate, and a first surface channel charge-coupled device with the portion of the substrate between said buried channel and an adjacent detector of one of the adjacent columns which will conduct charge from the said detector to the buried channel when a positive voltage is applied to the second gate and a second surface channel charge-coupled device with the portion of the substrate which is between the buried channel and an adjacent detector of the other adjacent column which will not conduct charge when the positive voltage is applied to the second gate to conduct charge in said first surface channel charge-coupled device, each of said first and second surface channel charge-coupled devices preventing conduction of current thereacross from the adjacent detector to the buried channel when a negative voltage is applied to the second gate.

6. An image sensor in accordance with claim 5 in which each of said first and second gates extends completely across the space between the columns of detectors and is insulated from the surface of the substrate to form the buried channel charge-coupled device with the buried channel and the surface channel charge-coupled devices with the portions of the substrate between the buried channel and the adjacent detectors.

7. An image sensor in accordance with claim 6 in which the gates are insulated from the surface of the substrate by a layer of silicon oxide on said substrate surface, with the gate being on said silicon oxide layer.

8. An image sensor in accordance with claim 7 in which each of said first gates has an extension extending over and insulated from the surface of the substrate between adjacent detectors of a column and forming a surface channel charge-coupled device which is adapted to prevent flow of charge between said adjacent detectors when a negative potential is applied to said first gate.

9. An image sensor in accordance with claim 7 in which the portion of the silicon oxide layer between the substrate surface and the portion of each second gate forming the second surface barrier charge-coupled device is thicker than the portion of the silicon oxide layer between the substrate surface and the portion of the second gate forming the first surface barrier charge-coupled device so that a positive voltage applied to the second gate to cause conduction across the first surface barrier charge-coupled device will not cause conduction across the second surface barrier charge-coupled device.

10. An image sensor in accordance with claim 7 in which the portion of the substrate under the portion of each second gate forming the second surface barrier charge-coupled device is of a higher conductivity than the portion of the substrate under the portion of each second gate forming the first surface barrier charge-coupled device so that a positive voltage applied to the second gate to cause conduction across the first surface barrier charge-coupled device will not cause conduction across the second surface barrier charge-coupled device.

11. An image sensor in accordance with claim 8 in which the extensions of said first gates electrically connect corresponding first gates of all of the registers in the spaces between adjacent columns of detectors.

12. An image sensor in accordance with claim 11 in which each of said second gates has an extension which extends over and is insulated from an extension of a first gate with said second gate extensions electrically connecting corresponding second gates of the registers in the spaces between adjacent columns of detectors.

13. An image sensor in accordance with claim 12 in which some of the extensions of the first and second gates extend to terminals at an edge of the image sensor.

14. An image sensor in accordance with claim 13 in which each of said detectors include an area of a conductive material forming a Schottky-barrier junction with the substrate.

15. An image sensor in accordance with claim 14 including a guard ring of a conductivity type opposite to that of the substrate within the substrate and around and contacting each area of conductive material.

16. A charge-coupled image sensor comprising
a substrate of single crystalline silicon of one conductivity type having a pair of opposed major surfaces.
a plurality of detector areas arranged in spaced relation along one of said substrate surfaces in a plurality of spaced columns,
a separate charge-coupled device register extending along said substrate surface between adjacent columns of the detectors, each register including
a buried channel of a conductivity type opposite to that of said substrate within the substrate and extending along said one surface between and spaced from adjacent columns of the detectors areas,
a first set of conductive gates spaced along and extending completely across the space between adjacent columns of detectors, each of said first set of gates forming a buried channel charge-coupled device with the buried channel within said space which is adapted to provide a channel potential when a voltage of one polarity is applied to the gate and form a surface channel charge-coupled device with the portion of the substrate between the buried channel and the detector areas of each of the adjacent columns which will not provide a channel potential therein when the voltage of one polarity is applied to the first set of gates,
a second set of conductive gate along and extending completely across the space between adjacent columns of detector areas with each of the second gates being between two of the first gates, each of said second gates forming a buried channel charge-coupled device with the buried channel within said space which will provide a channel potential when a voltage of the one polarity is applied thereto and, a surface channel charge-coupled device with the portion of the substrate between the buried channel and an adjacent detector area of one of the adjacent columns which will conduct charge from said detector area to the buried channel when a voltage of the opposite polarity is applied thereto, and
means under each of said second gates between each buried channel and the adjacent detector area of the other adjacent column of detector areas for preventing flow of charge from said detector area of the other adjacent column to the buried channel when a voltage of the opposite polarity is applied to the second gates.

17. An image sensor in accordance with claim 16 including a layer of an insulating material between the substrate surface and the gates.

18. An image sensor in accordance with claim 17 in which the means for preventing flow of charge from the adjacent detector area in the other adjacent column to the buried channel comprises a thicker layer of the insulating material between the second gate and the portion of the substrate between the buried channel and that adjacent detector area than between the second gate and the portion of the substrate between the buried channel and the adjacent detector area of the one adjacent column.

19. An image sensor in accordance with claim 17 in which the means for preventing flow of charge from the adjacent detector area in the other adjacent column to the buried channel comprises a region of the substrate under the second gate between the buried channel and the adjacent detector of the other column which is of a higher conductivity than the portion of the substrate under the second gate between the buried channel and the adjacent detector area of the one adjacent column.

20. An image sensor in accordance with claim 16 in which each of the gates has an extension extending over and insulated from a portion of the substrate between adjacent detector areas of a column with the extension of the second gates being over and insulated from the extensions of the first gates.

* * * * *